(12) United States Patent
Schwarzbach et al.

(10) Patent No.: US 11,876,371 B1
(45) Date of Patent: Jan. 16, 2024

(54) ELECTRIC POWER CIRCUIT TESTING DEVICE, SYSTEM, AND METHOD

(71) Applicants: Mark Schwarzbach, Satellite Beach, FL (US); John Hubert, Clermont, FL (US); Marc Edward Rippen, Palm Bay, FL (US)

(72) Inventors: Mark Schwarzbach, Satellite Beach, FL (US); John Hubert, Clermont, FL (US); Marc Edward Rippen, Palm Bay, FL (US)

( * ) Notice: Subject to any disclaimer, the term of this patent is extended or adjusted under 35 U.S.C. 154(b) by 0 days.

(21) Appl. No.: 18/100,406

(22) Filed: Jan. 23, 2023

(51) Int. Cl.
*G01R 19/155* (2006.01)
*H02J 13/00* (2006.01)

(52) U.S. Cl.
CPC ...... *H02J 13/00002* (2020.01); *G01R 19/155* (2013.01); *H02J 13/00034* (2020.01); *H02J 13/00036* (2020.01)

(58) Field of Classification Search
CPC .............. G01R 19/2513; G01R 22/063; G01R 19/155; G01R 21/133; G01R 19/00; G01R 21/06; G01R 22/10; G01R 19/0092; G01R 19/0084; G01R 31/085; G01R 31/11; G01R 31/40; G01R 13/00; G01R 31/00; G01R 22/068; G01R 31/371; G01R 19/145; G01R 29/085; G01R 31/007; G01R 31/3835; G01R 31/3842; G01R 22/066; H04Q 9/00; H04Q 2209/40; H04Q 2209/30; H04Q 2209/60; H04Q 2209/84; H04Q 2209/823; H04Q 2209/50; H04Q 2209/43; H04Q 2209/10; H04Q 2209/25; G01D 18/00; G01D 4/004; G01D 4/008; G01D 3/022; G01D 21/00; G01D 4/006; G01D 21/02; G01D 4/002; H04L 12/40045; H04L 2012/2843; H04L 67/025; G08C 17/02; G08C 2201/51; G08C 19/12; G08C 2201/10; G08C 2201/12; G08C 2201/93; G08C 19/00; G08C 2201/32; G08C 19/02;

(Continued)

(56) References Cited

U.S. PATENT DOCUMENTS 5,895,985 A * 4/1999 Fischer ............. H02J 13/00006
307/34
6,828,695 B1 * 12/2004 Hansen ................ G01R 22/066
307/31

(Continued)

*Primary Examiner* — Vinh P Nguyen
(74) *Attorney, Agent, or Firm* — The Concept Law Group, PA; Scott D. Smiley; Scott M. Garrett

(57) ABSTRACT

The mapping of electric power distribution circuits and electric power outlets to breakers in a breaker panel is accomplished by providing a plurality of smart power testing devices and a control device that communicates with each of the smart power testing devices. Each of the smart power testing devices is connected to a respective one of the electric power outlets in a structure. Each smart power testing device can detect the AC voltage level provided at the electric power outlet. A user opens each breaker in the breaker panel, in succession. When a smart power testing device senses loss of AC voltage, it transmits a message to the control device. The control device can then identify which outlets are on a common electric power circuit, and by opening each breaker in succession, the control device can creating a mapping of outlets to breakers.

4 Claims, 10 Drawing Sheets

(58) Field of Classification Search
CPC ....... H02H 9/02; H02H 1/003; H02J 13/0036; H02J 13/00034; H02J 13/00002
See application file for complete search history.

(56) References Cited

U.S. PATENT DOCUMENTS

| | | | |
|---|---|---|---|
| 7,221,106 B1 * | 5/2007 | Nemir | H02M 5/2573 307/41 |
| 7,385,406 B1 * | 6/2008 | Blades | G01R 31/58 324/508 |
| 8,773,827 B2 * | 7/2014 | Kiko | H02J 13/00036 361/62 |
| 9,160,168 B2 * | 10/2015 | Chapel | H02J 13/00004 |
| 9,876,355 B2 * | 1/2018 | Bennett | G05F 1/66 |
| 9,958,925 B2 | 5/2018 | Chapel et al. | |
| 10,205,343 B2 * | 2/2019 | Van Ostrand | H02H 3/093 |
| 10,353,359 B1 | 7/2019 | Jordan, II et al. | |
| 10,978,834 B1 * | 4/2021 | Farruggella | H01R 31/065 |
| 2017/0025842 A1 | 1/2017 | Peterson | |
| 2017/0025892 A1 | 1/2017 | Van Ostrand et al. | |
| 2020/0106637 A1 | 4/2020 | Jakobsson | |
| 2020/0120202 A1 | 4/2020 | Jakobsson et al. | |
| 2020/0212959 A1 | 7/2020 | Eriksen et al. | |

* cited by examiner

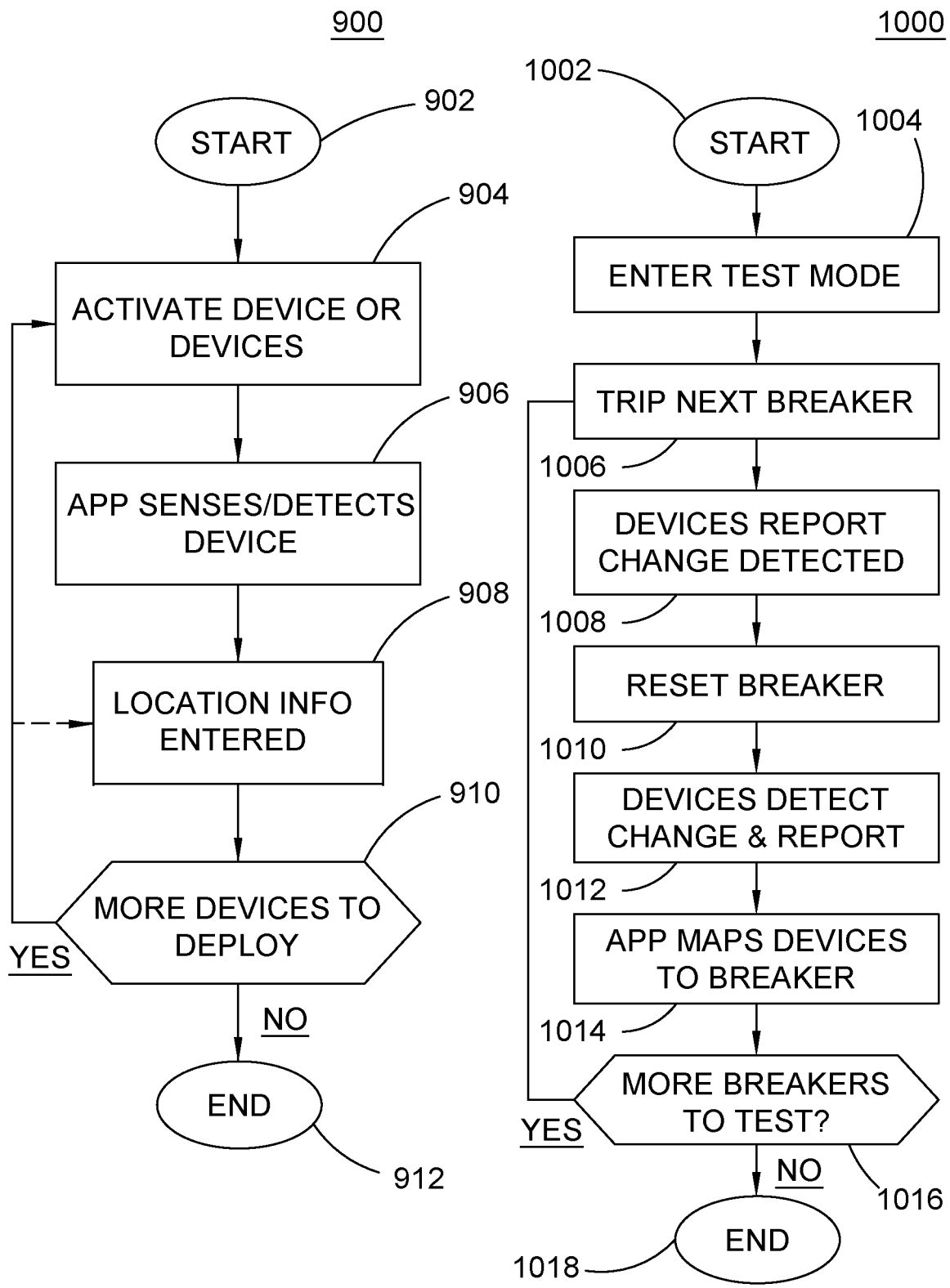

ELECTRIC POWER CIRCUIT TESTING DEVICE, SYSTEM, AND METHOD

FIELD OF THE INVENTION

The present invention relates generally to electric power circuit testing, and, more particularly, relates to a device, system, and method for mapping electric power outlets in a structure to a circuit breaker at the breaker box of the structure.

BACKGROUND OF THE INVENTION

Structures such as residences and other buildings are commonly wired to provide commercial electric power at various locations throughout the structure. Electrical outlets are provided along walls that allow a person to plug in a power cord for an electrically-powered device in order to power the device. In a typical structure such outlets are organized on circuits that are fed from a circuit breaker panel or "breaker box." The arrangement of circuits is to prevent the wiring from experiencing a high current level, which can heat the wiring and possibly lead to burning or even fire, among other issues. By distributing electric power among multiple circuits, the power load on any one circuit can be managed to a safe level. Each wiring circuit is controlled by a circuit breaker. Circuit breakers are designed to "trip," or break the circuit in response to a high electric current level, removing power from the circuit and preventing an undesirable effect on the circuit wiring. Once a structure is built, various different people may live in or otherwise use the structure, not knowing which outlets are grouped together on a common circuit. As a result, people may overload one circuit, causing a circuit breaker to trip, necessitating reset and moving one or more devices to other outlets that was hopefully on a different circuit. In such cases it would be beneficial to know which outlets are on a common circuit to avoid overloading the circuit again.

Further, In many structures/residences it is common for one or more of the wiring circuits to have a ground fault circuit interrupter (GFCI) in one of the outlets. When the GFCI trips, it acts like a breaker, preventing current from flowing in the circuit. However, the breaker for the circuit will not be tripped, so a person examining the breaker panel will not find any tripped breakers to reset. The specific GFCI outlet must be found and reset. Given that different outlets on a given circuit can be located in different rooms, it would be of benefit to know exactly which outlets are electrically located together on a given circuit so that if a GFCI trips, the user will know where to go to find the correct GFCI outlet in order to reset the GFCI mechanism.

Typically when people move into a residence or begin using a building, they will not know the layout of the various electrical power distribution circuits. Over time, when power demand surges cause breakers to trip they may learn some that some outlets are on common circuits, but generally people do not know how to map out outlets to circuits. A person could determine which outlets are on common circuits by, for example, selectively shutting off one breaker at a time, and checking each outlet to see if there is electricity available or not. Those outlets with no electricity will be on a circuit controlled by the selected breaker. This process can be tedious, which is likely why few people have done it, even in their own home.

Therefore, a need exists to overcome the problems with the prior art as discussed above.

SUMMARY OF THE INVENTION

In accordance with some of the inventive embodiments disclosed herein, there is provided a method for mapping electric power distribution circuits in a structure, the structure being wired with a plurality of electric power circuits, each one of the plurality of power circuits being controlled by a respective one of a plurality of breakers at a breaker panel of the structure, and each one of the plurality of electric power circuits having a plurality of electric power outlets. The method including connecting, to each one of the plurality of electric power outlets, a respective one of a plurality of smart power testing devices. The method further including changing a state of one of the plurality of breakers to remove power for a power circuit connected to the one of the plurality of breakers. The method also including receiving, at the mobile device from at least one of the plurality of smart power testing devices, an indication of a change in voltage being detected by the at least one of the smart power testing devices.

In accordance with a further feature, connecting each respective one of the plurality of smart power testing devices comprises activating each respective one of the plurality of smart power testing devices.

In accordance with a further feature, the method further includes, after each respective one of the plurality of smart power testing devices is connected to o each one of the plurality of electric power outlets, wirelessly pairing the respective one of the plurality of smart power testing devices with the mobile device.

In accordance with a further feature, the method further includes after receiving the indication of the change in voltage, the mobile device, in an electronic record, mapping the at least one of the plurality of smart power testing devices to the one of the plurality of breakers.

In accordance with a further feature, the method further includes transmitting, from the mobile device to one of the plurality of smart power testing devices, a ground fault command, generating, at the one of the plurality of smart power testing devices, a ground fault, and receiving, at the mobile device from at least one other of the plurality of smart power testing devices, an indication of a loss of voltage at the at least one other of the plurality of smart power testing devices.

In accordance with a further feature, the method further includes receiving at the mobile device, an electric power status from each one of the plurality of smart power testing devices, wherein the electric power status indicates whether the respective smart power testing device detects electric power.

In accordance with a further feature, the method further includes displaying, on the mobile device, the electric power status of each one of the plurality of smart power testing devices.

In accordance with some of the inventive embodiments disclosed herein, there is provided a smart power testing device including a battery, a processor, an AC connector configured to connect to an AC outlet. The AC connector including at least a hot lead and a neutral lead. The device further including an AC detection circuit coupled to the AC connector that provides an output to the processor indicating whether a commercial level of an AC voltage is present at the AC connector. The device further including a wireless network transceiver that is operably coupled to the processor and powered by the battery, and that communicates using a wireless networking protocol. The device further including a memory coupled to the processor that includes instruction code that causes the processor to associate, via the wireless network transceiver, with a remote device, and transmit a message to the remote device, when the output of the AC detection circuit indicates a significant change in the AC voltage.

In accordance with a further feature, the device further includes a button operably coupled to the processor which, upon being actuated, alternatively activates and deactivates the smart power testing device.

In accordance with a further feature, the device further includes a ground lead in the AC connector, and a ground fault circuit configured connected to the hot lead, neutral lead, and ground lead and operable by the processor to simulate a ground fault sufficient to cause a ground fault circuit interrupt in a common power circuit to activate.

In accordance with a further feature, the AC connector is modular and removable.

In accordance with some of the inventive embodiments disclosed herein, there is provided a system for identifying and testing electric power distribution circuits in a structure. The structure including a breaker box having a plurality of breakers, each one of the breakers connected a respective one of a plurality of electric power circuits in the structure, each one of the plurality of electric power circuits having at least one outlet in the structure. The system including a plurality of smart power testing devices. Each one of the plurality of smart power testing device connected to a respective one of a plurality of electrical outlets in the structure. The system further including each one of the plurality of smart power testing devices having a processor, an AC voltage detector configured to provide an output to the processor indicating the presence of an AC voltage at an AC connector, and a wireless transceiver coupled to the processor. The system further including a control device having a wireless transceiver conjured to communicate with each of the plurality of smart power testing devices. Each one of the plurality of smart power testing devices is configured to detect a change in AC voltage at its respective one of the plurality of electric power outlets, and upon detecting the change in AC voltage to transmit a message to the control device indicated detection of the change in AC voltage.

In accordance with a further feature, the control device creates a record of the plurality of electric power outlets, and which of the plurality of smart power testing devices indicate detection of change in AC voltage contemporaneously.

In accordance with a further feature, each one of the plurality of smart power testing devices are configured to transmit a deactivation message to the control device upon being deactivated.

In accordance with a further feature, the control device is configured to detect a loss of connection with any of the plurality of smart power testing devices that have not been deactivated, and provide an alert in response.

Although the invention is illustrated and described herein as embodied in an electric power testing device, system, and method, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

"In the description of the embodiments of the present invention, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second", "third" and so on are only used for descriptive purposes, and cannot be construed as indicating or implying relative importance.

In the description of the embodiments of the present invention, it should be noted that, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system. Those skilled in the art can understand the specific meanings of the above-mentioned terms in the embodiments of the present invention according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 9 shows a flow chart diagram of a method for initializing a plurality of smart power testing devices, in accordance with some embodiments;

FIG. 10 shows a flow chart diagram of a method for serially tripping and resetting breakers and determining which smart power testing devices indicate detection of a change in electric voltage, and mapping the locations of the smart power testing devices to the respective breaker, in accordance with some embodiments.

DETAILED DESCRIPTION

Figure 1:
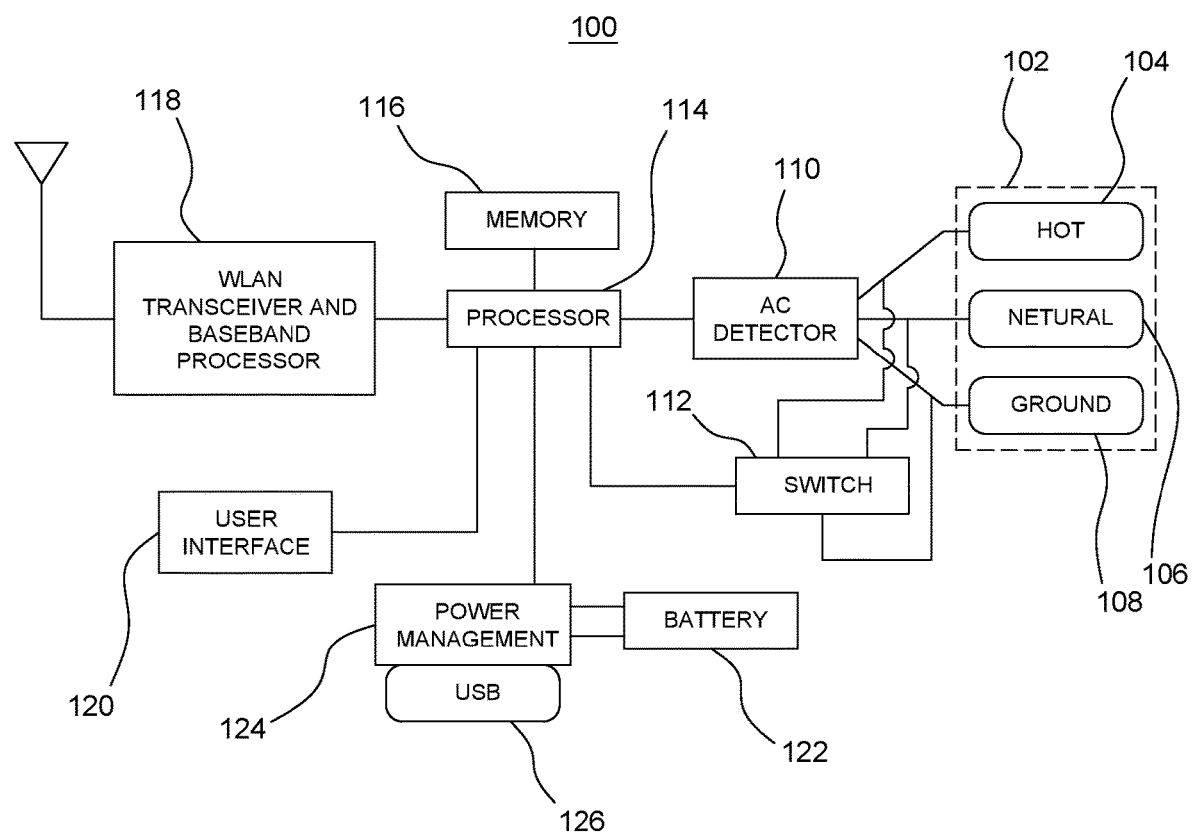
FIG. 1 a block schematic diagram of a smart power testing device, in accordance with some embodiments.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

FIG. 1 a block schematic diagram of a smart power testing device 100, in accordance with some embodiments. The smart power testing device 100, or simply device 100 includes an electrical connector 102 that is configured to connect to an electrical outlet through which commercial electric power is typically provided. The outlet can be a wall socket, a light socket, a high voltage socket, and so on. As is known, various voltage ranges can be provided through an electrical outlet, depending on the region of the world. In some regions, such as North America, the voltage is typically around 120 volts (RMS—root mean square). In other parts of the world the voltage can be 240 volts. Likewise, the frequency of the AC voltage is typically around 50-60 Hertz, depending on the region. In addition, some electrical outlets provide multi-phase voltage. The smart power testing device 100 can be configured for testing electric power/voltage in any region of the world. For example, the electrical connector 102 can be changed (replaced) on the device for a particular type of outlet, or an adapter can be used to connect to a given type of outlet. An outlet, as used here, refers to a fixed electrical connector that is designed to provide electrical power. As is known, electrical outlets are arranged in circuits from a breaker panel or breaker box. Each electric power circuit can have one or more outlets connected electrically in parallel. While the voltage level is controlled by the entity providing the electric power, the breaker limits the amount of electrical current distributed to its respective circuit and "trips" (opens) whenever an excessive amount of current or power is drawn by the circuit, thereby disconnecting the circuit from a main source of electrical power, and preventing any more electrical power from being distributed to the circuit. In general, the electrical connector 102 is an AC connector, and will have at least a "hot" lead 104 and a neutral lead 106, and can also have a ground lead 108. The leads 104, 106, 108 can be in the mechanical configuration necessary for a given outlet. That is, they can be prongs to fit into a wall socket outlet, or a screw-type fitting for a light socket outlet, and so on, including various configurations for various countries and regions. The AC detector 110 includes an AC sensing circuit and can be configured to detect or sense AC voltage in a wide range to accommodate use in various regions of the world. Specifically the AC detector is configured to detect AC voltage at a commercial level, meaning the range of voltage provided by commercial power utilities. The AC detector 110 can also be configured to detect multi-phase voltage sources. In some configurations the leads 104, 106, 108 can be terminals or clips for attaching to bare wire intended to be connected to an outlet socket.

Each of the leads 104, 106, 108 are coupled to an AC detector circuit 110 that detects whether there is an AC voltage present between the leads 104, 106, 108. The AC detector 110 can rectify and scale the AC voltage down to a low level DC voltage which can be compared to a voltage reference. An indication of the result of that comparison can be provided as an output to a processor 114 to indicate whether there is an AC voltage present at the leads 104, 106, 108. In some embodiments, the AC voltage detector 110 can be configured to detect voltage between each lead 104, 106, 108, and a polarity, to ensure that the wiring is correct (e.g. ground 108 is connected to the electrical ground, and not the hot line). Thus, the AC detector can provide more than one output to the processor 114, where each output indicates the presence of AC voltage between other leads 104, 106, 108. Thus, if AC voltage is detected between the hot lead 104 and the neutral lead 106, but not between the hot lead 104 and the ground lead 108, then there may be a fault in the wiring. The output(s) of the AC detector 110 can be asserted as long as there is an AC voltage present at the electrical connector 102, and then de-asserted when there is no AC voltage detected. The processor 114 can receive the output(s) as a binary logic level signal as one or more inputs. A change in an output from the AC detector can trigger an interrupt, causing the processor to report the change, as will be described. Furthermore, when the AC connector 102 is configured to connect to a multi-phase outlet, there will be multiple "hot" leads for each of the phases.

Figure 11:
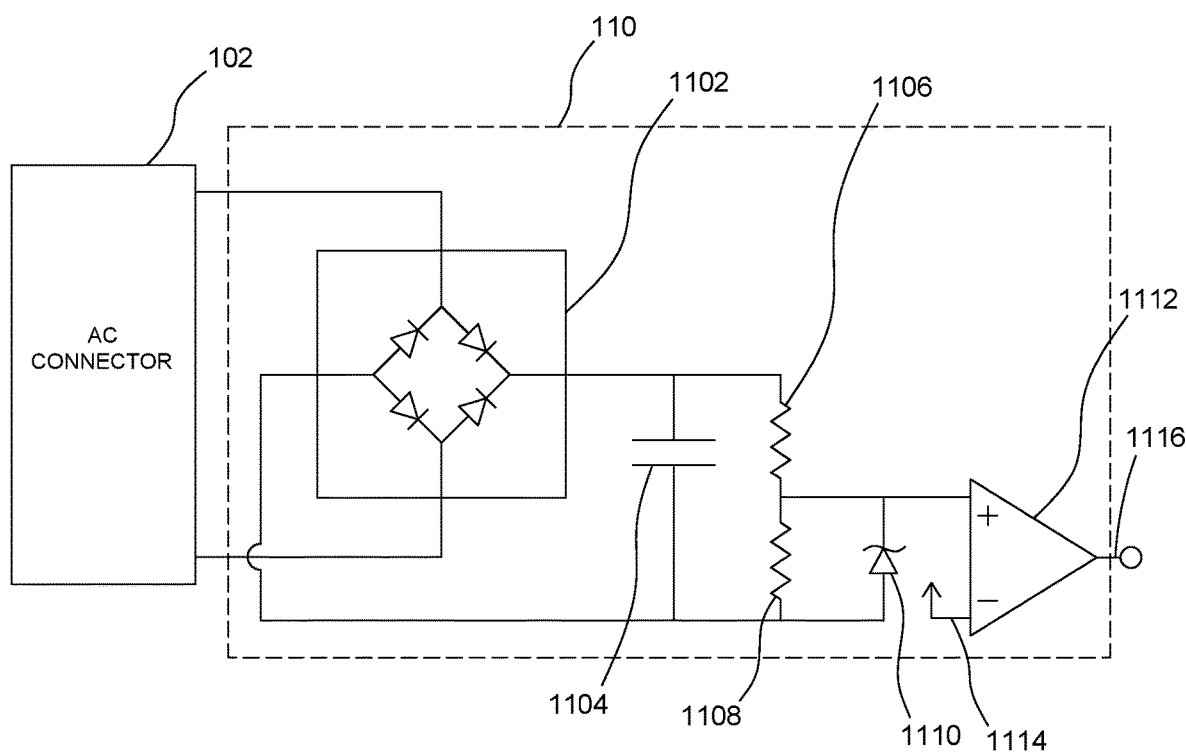
FIG. 11 shows a schematic diagram of an AC detector, in accordance with some embodiments.

Briefly, FIG. 11 shows a schematic diagram of an AC voltage detector 110, in accordance with some embodiments. The AC voltage detector 110 is coupled to the AC connector 102, and is connected to the hot and neutral leads as is known. The AC voltage detector can include a rectifier bridge 1102 that receives any AC voltage from the AC connector 102 and, in combination with a bulk filter capacitor 1104 converts the received AC voltage into a DC voltage, as is well known. The DC voltage will have a magnitude about equal to the peak of the AC voltage waveform, and is fed to a voltage divider comprised of series-connected resistors 1106, 1108. The connector node between the two resistors 1106, 1108 is fed to a comparator 1112 which compares the output of the voltage divider to a reference voltage 1114. The voltage divider and reference voltage 1114 can be selected so that some minimum level of AC voltage must be present at the AC connector at which level the output of the voltage divider 1106, 1108 will exceed that of the reference voltage, causing the comparator output 1116 to change state. The comparator output 1116 can be provided to the processor as an input to indicate the presence of AC voltage. In some embodiments the output of the voltage divider 1106, 1108 can be fed to an analog to digital converter to allow a quantization of the voltage level to be determined by the processor. A voltage clamp 1110, such as a Zener diode, can be used to prevent the output of the voltage divider 1106, 1108 exceeding a maximum level to protect the comparator 1112 or any other circuitry connected to the voltage divider 1106, 1108. Similar circuitry can be duplicated for multi-phase AC voltage detection. Further, the circuit can be duplicated with different voltage divider resistance values to distinguish between, for example, 120 VAC and 240 VAC.

The processor 114 can be a microprocessor or microcontroller, and can be further coupled to a memory 116. The memory 116 can represent an aggregation of several types of memory, including random access memory (RAM), read only memory (ROM), and/or flash memory that can be reprogrammed. In general, the memory 116 contain at least a non-volatile memory component for storing instruction code, and an addressable memory component for instantiating instruction code for execution, variables, and other data structures that are used in the execution of instruction code. The instruction code is configured to control the processor's operation and outputs based on inputs received from, for example, the AC detector, the wireless transceiver 118, user interface 120, and power management circuit 124 to accomplish, generally the functions described herein.

The processor 114 is interfaced with a wireless network transceiver 118. In some embodiments the wireless transceiver 118 can be one of multiple such wireless transceivers included in the smart power testing device 100, each of which operate according to the different wireless networking protocol and air interface. For example, the wireless network transceiver 118 can operate according to one of the protocols specified under specification 802.11 of the Institute of Electrical and Electronics Engineers (IEEE), which include protocols know publicly by the names "WiFi," "BlueTooth," and "Zigbee," to name several commonly used interfaces. The wireless network transceiver 118 can include a baseband processor that controls the transmission and reception of information according to an established protocol, and communicates information to the processor 114, as well as receiving information from the processor 114 for transmission to another device. Furthermore, the wireless network transceiver will typically have a unique media access controller (MAC) address that is used to identify it in communications with other devices.

The processor 114 can be further operably connected with user interface elements, such as buttons to receive input (e.g. to activate/deactivate the device 100), and light elements to indicate status, detection of voltage, etc. In some embodiments the smart power testing device 100 can be initialized, for example, by pressing a button that is operably coupled to the processor 114. By pressing the button a signal is provided to the processor 114 that causes the processor 114 to initiate a wireless connections. Specifically, the processor 114 can control the wireless network transceiver 118 to broadcast a radio beacon that can be detected by other devices. The radio beacon allows another device to "pair" with the smart power testing device 100, and thereafter communicate with the smart power testing device 100. In the initialization process, as is well known, the smart power testing device 100 can transmit its identifier (e.g. MAC address), which can also be printed on the outside of the smart power testing device 100, allowing a technician to confirm which smart power testing device is presently being detected by another device that will communicate with the smart power testing device 100.

The smart power testing device 100 is powered by its own battery 122 so that, when there is no AC voltage at the AC connector, the smart power testing device 100 can still operate and communicate. The charge state of the battery 122 can be managed by a power management circuit 124 that can ensure the battery 122 is not over-charged, among other well-known battery management functions. The battery 122 can be charged using power from the AC connector when the smart power device 100 is coupled to an AC outlet, and the smart power testing device can also include a connector, such as a common universal serial bus (USB) connector 126 to connect to a direct current (DC) power source for charging the battery 122.

In some embodiments the smart power testing device 100 can test the ground fault circuit interrupt (GFCI) function of an outlet on a given circuit. To accomplish this, a ground fault circuit including a switch 112 can be used to momentarily short the hot lead 104 or neutral lead 106 to the ground lead 108 to create an imbalance in current from the hot lead 104 returning through the neutral lead 106, causing the GFCI protector on the circuit to trip, shutting off electricity to all outlets on the circuit. This process does not involve turning off a breaker. Rather, a remote device to which the smart power testing device 100 is paired can command the smart power testing device 100 to activate the switch 112 in an attempt to trip the GFCI device on the circuit to which the smart power testing device 100 is connected. In some embodiments, the smart power testing device 100 can also be provided with a button or similar using input device to manually cause the a GFCI fault at the smart power testing device 100 in the same way as if it were remotely controlled to do so.

In general, a plurality of smart power testing device such as that shown in FIG. 1 are each connected to an electrical outlet in a building or structure being mapped. As each smart power testing device is deployed, it is communicatively linked to a control device, which can be, for example, a tablet computing device, a smartphone device, a laptop or other portable computer device, and so on. Once all of the smart power testing devices are deployed and linked to the control device (using a wireless networking protocol), the status of each smart power control device can be seen on the control device. Prior to turning off any breakers, all of the deployed smart power testing devices will indicate that they detect AC voltage at their respective electrical outlet to which they are connected. Once a user turns off a breaker, then several of the deployed smart power testing devices will detect the drop or loss of AC voltage, and will each transmit a message to the control device indicating such. The control device can then display to the user which smart power testing devices lost AC voltage, indicating which outlets are on that breaker's circuit. Then the breaker can be turned back on, and same smart power devices, sensing another change in AC voltage, can again each transmit a message confirming AC voltage has resumed, confirming that the respective outlets are connected to the breaker being tested. The control device can then create a record indicating which outlets are connected to the breaker by name.

Figure 2:
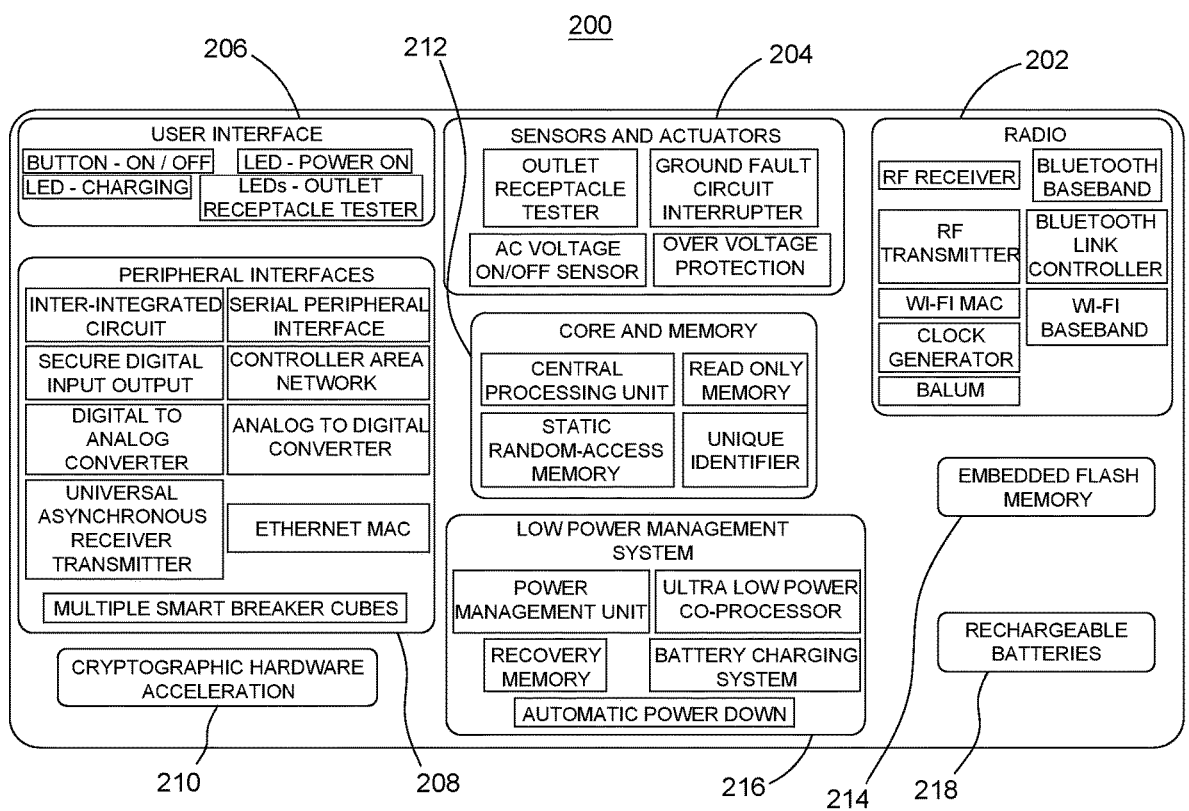
FIG. 2 shows sub-system block diagram of sub-systems and components included in a smart power testing device, in accordance with some embodiments.

FIG. 2 shows sub-system schematic diagram of sub-systems and components included in a smart power testing device 200, in accordance with some embodiments. Where FIG. 1 shows the essential functions and circuit elements, FIG. 2 shows a more complete block schematic of circuits and components, which are various sub-systems of the smart power testing device 200, which can be in a smart power testing device generally. Not all of the sub-systems shown need to be present in every smart power testing device used.

The smart power testing device 200 includes a radio system 202 which facilitates low power wireless networking. To accomplish that a radio frequency (RF) transmitter and receiver are required, which are typically combined in an RF transceiver. The RF transceiver generates a carrier signal from a clock generator. The carrier signal is at a frequency selected for a particular wireless network protocol. The RF transmitter modulates the carrier signal using an information signal to be transmitted. The modulation can be digital modulation where digital information varies one or more characteristics of the carrier signal. The modulated carrier signal can be fed to an antenna through a balun for impedance matching. Likewise, the RF receiver is used to receive a modulated signal at the carrier signal frequency (which may or may not be the same as the transmission frequency, and may be offset from the transmission frequency by a prescribed frequency offset, depending on the communication protocol). The RF receiver uses the locally generated carrier signal to demodulate the received modulated signal and extract the modulating signal that has information in it. Thus, demodulating a digitally modulated signal will produce a digital signal that can be formatted into digital information, as is well known. The radio sub-system can include one or both of a WiFi controller and a BlueTooth controller, including WiFi baseband processing and BlueTooth baseband processing and link control. In general, the radio system 202 includes one or more conventional and well-known wireless network communication sub-systems.

The smart power testing device 200 further includes several sensors and actuators sub-systems 204. These include, for example, an outlet receptacle tester, and AC voltage detector (e.g. on/off), a ground fault circuit interrupter tester, and overvoltage protection at the AC detector to prevent surges or voltage spikes from damaging the smart power testing device 200 when connected to an AC outlet. A user interface sub-system 206 can include an on/off button for turning the device 200 on or off. The user interface sub-system 206 can include light elements such as light emitting diodes (LEDs) for indicating various statuses, such as whether the battery is charging, whether AC voltage is detected, whether the device 200 is presently linked with a control device over a wireless network link, and so on.

The smart power testing device 200 can also include various peripheral sub-systems. For example, both an analog to digital (A/D) and a digital to analog (D/A) converter can be used to convert analog signals to digital values, and to create analog signals from digital values. The device 200 can include systems for wired communication, such as, for example, a serial peripheral interface (SPI), Ethernet connector and controller, universal asynchronous receiver transmitter (UART), a secure digital input/output, to name a few types of local wired communication modes. It is contemplated that when multiple smart power testing devices are used to test a given structure, it may be necessary that the smart power testing devices can form an ad hoc mesh network to communicate with a control device, relaying data from one smart power testing device to another in order to extend the range of communications. The device 200 can also use cryptographic hardware acceleration 210 to facilitate computations on the edge of the system and secure the communications.

The smart power testing device 200 includes a processing system 212, including a central processing unit (CPU), ROM, RANI, and can include a unique identifier that is separate from the MAC address or other identifiers in the other sub-systems. Further, the processing system can include reprogrammable memory, such as flash memory 214, to allow firmware updates, for example. A power management sub-system 216 can operate in conjunction with a rechargeable battery 218 that powers the various sub-systems. The power management system can include, for example, a power management unit, an automatic power down circuit that softly shuts down the device 200 if the rechargeable battery power drops below a threshold level, and a charging system to control charging of the rechargeable battery 218. For low power operation, an ultra-low power co-processor can be used that can perform some processing at a voltage level below that required to operate the main processing components 212. Further, a recovery memory can be used to store critical data and program execution state information in the event of an emergency shut down, so that, upon being recharged and resuming normal operation, the processor can start up essentially where it was when the shutdown occurred.

Figure 3:
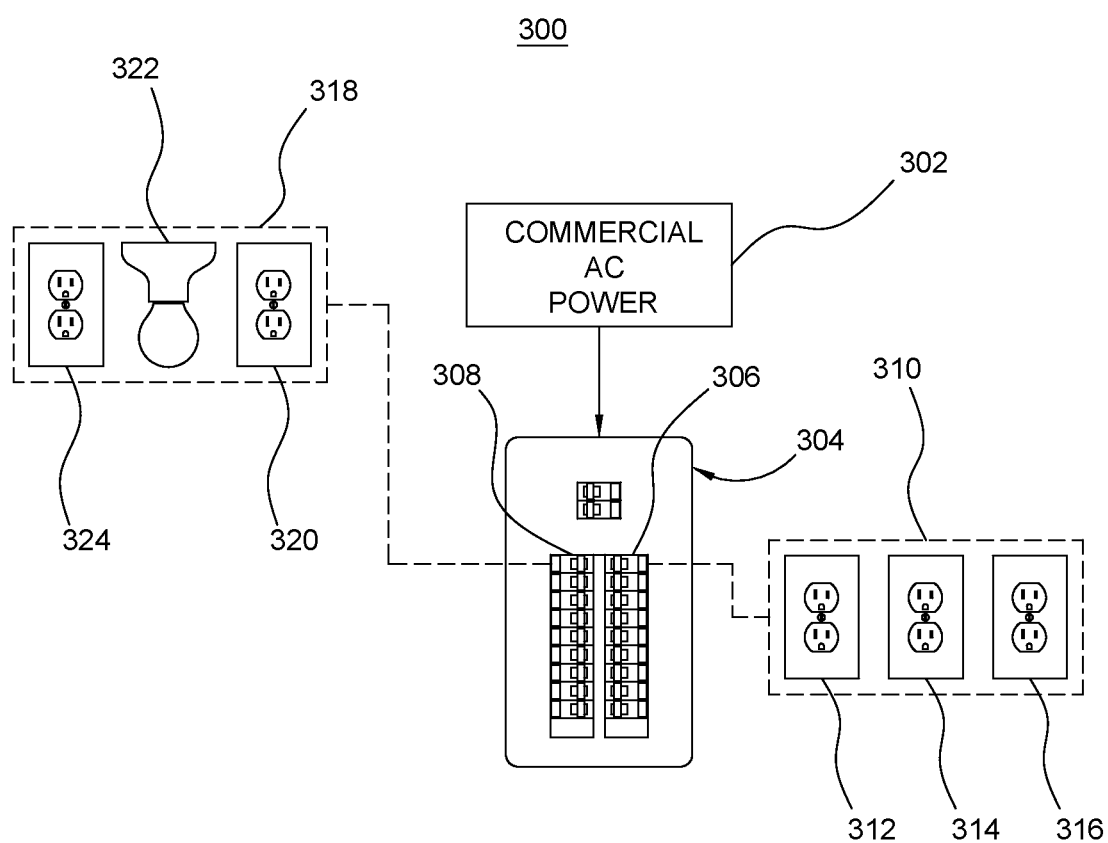
FIG. 3 shows a breaker panel and local circuit diagram, in accordance with the prior art.

FIG. 3 shows a breaker panel and local circuit diagram, in accordance with the prior art, to illustrate the system 300 in which the inventive embodiments operate. A source of commercial electric power 302 is connected to a breaker panel 304. The commercial electric power is generally provided at a standardized AC voltage, at a standardized frequency, depending on the region. The breaker panel includes a plurality of breakers such as breakers 306, 308. Breaker 306 distributes electric power to an electric power circuit 310 which includes several outlets 312, 314, 316 that are connected electrically in parallel. A typical structure will have a plurality of electric power circuits, each one connected to and controlled by a respective one of the plurality of breakers. If any device connected to one of the outlets 312, 314, 316 draws an excessive amount of power (based on current), then the breaker 306 will automatically open, removing power from the circuit 310. The outlets 312, 314, 316 are located in various locations in a structure, such as a house, an office, etc. Likewise, breaker 308 provides power to circuit 318, which include outlets 320, 322, 324. Outlets 320 and 324 are ordinary wall plug type outlets, and outlet 322 is a lighting fixture outlet. Other types of outlet can also be included in a given circuit. Outlets 320, 322, 324 are also located at different locations in the structure in which the breaker panel 304 is located. The knowledge of which outlets are co-connected to a given breaker's electric power circuit can be lost or just unknown to a person. The inventive devices, systems, and methods disclosed herein allow a person to determine which outlets in a structure are connected to each breaker, as well as to verify that all of the (tested) outlets are receiving the proper level of voltage.

Figure 4:
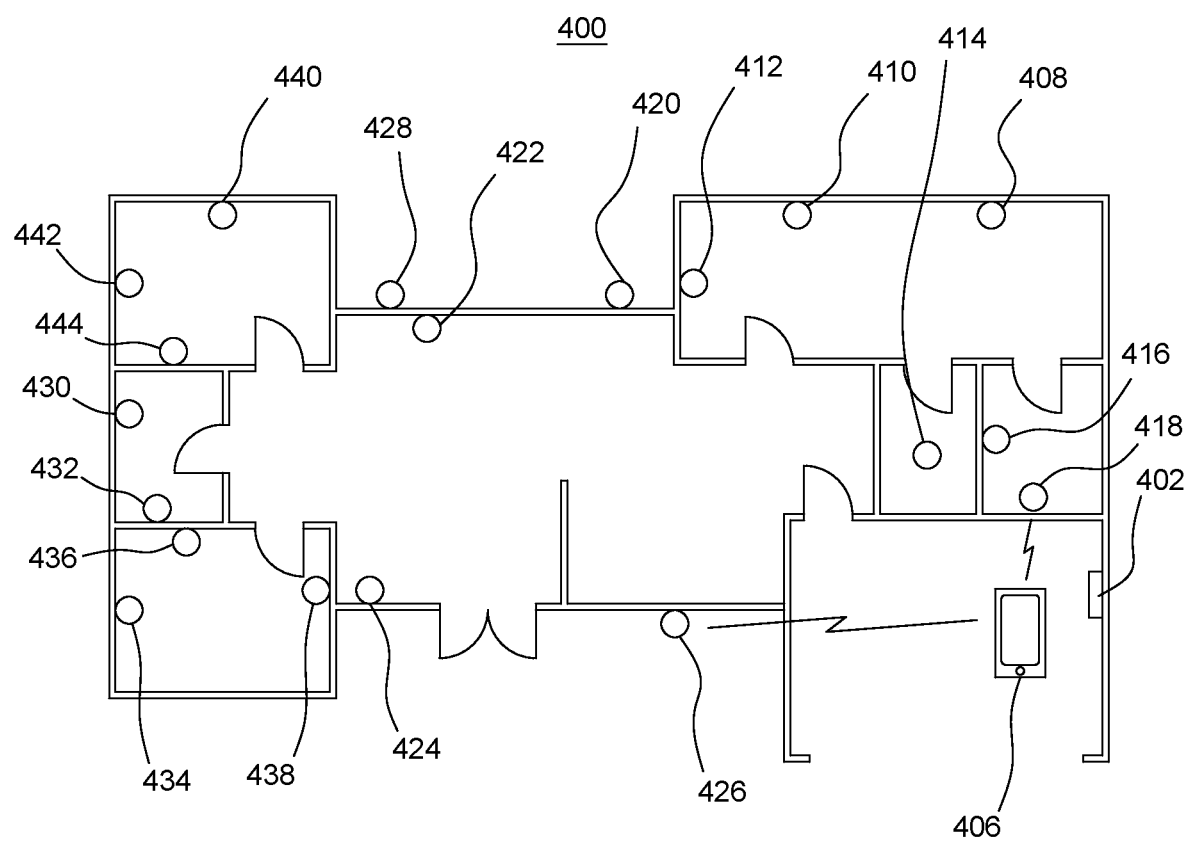
FIG. 4 shows a deployment of a plurality of smart power testing devices, in accordance with some embodiments.

FIG. 4 shows a plan of a house 400 as an example of a structure in which the deployment of a plurality of smart power testing devices is used to map outlets to specific breakers, in accordance with some embodiments. A breaker panel 402 is located in a garage portion of the house 400. The breaker panel can be substantially the same as breaker panel 304 of FIG. 3, or any known, suitable breaker panel used in such structures. The house 400 includes several rooms, including bedrooms, bathrooms, closets, a kitchen, a living room and so on, as is known. Each room can have one or more outlets that are wired to be on a circuit of one of the breakers on the breaker panel 402. The outlets can include wall plug outlets, lighting fixtures, utility outlets, and some of these outlets can have ground fault interrupter circuity.

A control device 406 is a computing device that runs an application program to wirelessly interface to each of a plurality of smart power testing devices, and to provide an interface for a user to see information related to the smart power testing devices. The control device 406 can be, for example, a smartphone device, a tablet computer device, a laptop computer, as examples. A first bedroom can have smart power testing devices 408, 410, 412 deployed. As used here, the term "deployed" means that the smart power testing device is connected to an outlet (or outlet wiring), and is communicatively linked to the control device 406. A closet of the first bedroom can have smart power testing device 414 deployed at a ceiling light fixture, while a bathroom of the first bedroom can have devices 416, 418 deployed at wall sockets. Smart power control devices 420-444 are similarly deployed throughout the house at other outlets. Smart power testing devices 426, 428 are shown deployed at outdoor outlets. Each of the smart power testing devices 408-444 can communicate either directly with the control device 406, or, using a known form of mesh networking, through others ones of the smart power testing devices 408-444. Each smart power testing device 408-444 can communication the electric power status they each respectively detect at the particular outlet to which they are each connected. If the detected voltage changes substantially at a given outlet, such as will occur when the breaker to which that particular outlet is connected is opened, the particular smart power device can transmit a message to the control device 406 that includes in indication of a detected change in voltage.

Figure 5:
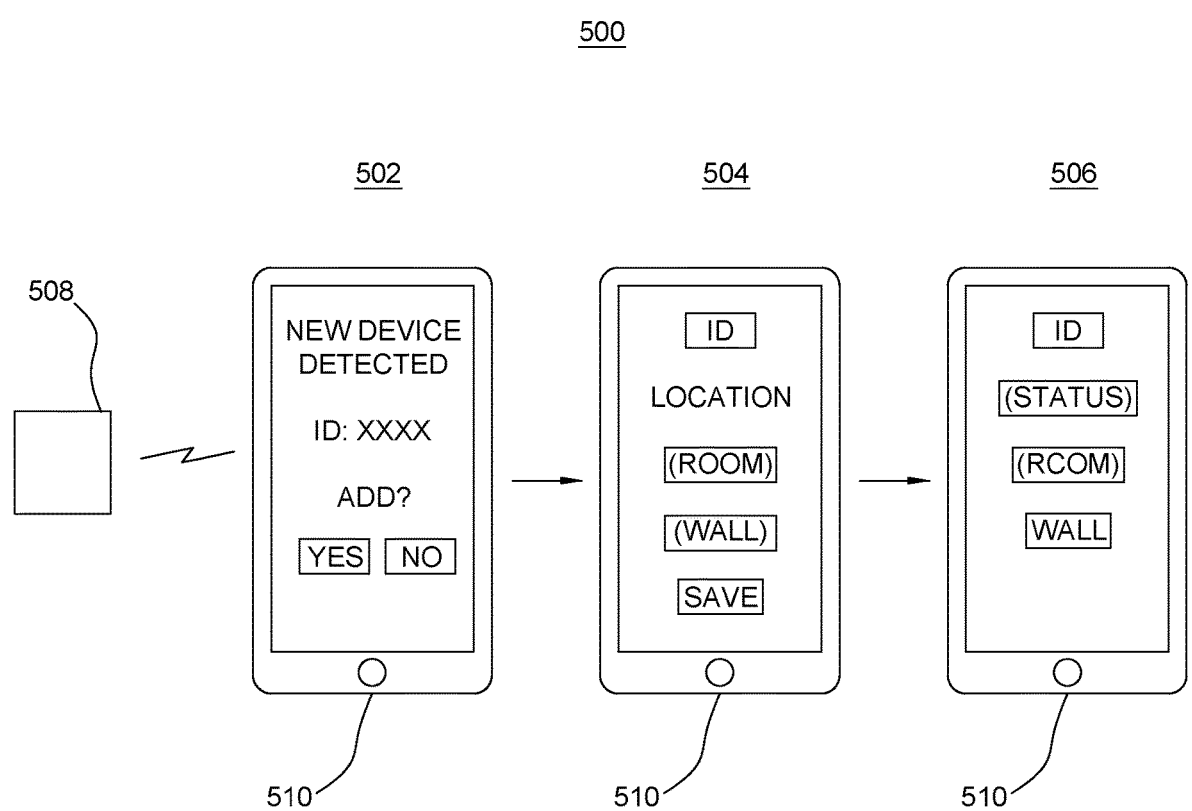
FIG. 5 shows an interface sequence of a mobile device running an application for operating smart power testing devices for a process of detecting smart power testing devices and assigning them to a location in a structure, in accordance with some embodiments.

The control device 406 has a record of each smart power testing device 408-444 that includes each device's unique identifier, and a description of where the device is located in the house 400. The process for deploying the devices 408-444 is exemplified in FIG. 5, which shows an interface sequence of a mobile device 510 running an application for operating smart power testing devices (e.g. 408-444) for a process of detecting smart power testing devices and assigning them to a location in a structure, in accordance with some embodiments. The mobile device 510 can be the control device 406 in FIG. 4, and is shown in three different interface states 502, 504, 506, and acts as a control device (e.g. 406). In a first interface state 502, the mobile device 510 has detected a smart power testing device 508, which can be any one of devices 408-444. Smart power testing device 508 can be configured as shown in FIGS. 1 and/or 2 and can wirelessly communicate with the mobile device 510. When the smart power testing device 508 is turned on, it can broadcast its identifier on prescribed channel that is received by the mobile device. Thus, in interface state 502, the application program displays an interface indicating that a device has been detected (e.g. after turning on device 508), giving the user the option to add the detected smart power testing device 508 to the list of deployed devices. The identifier of the device 508 can also be displayed so that the user can visually confirm it is the same device indicated as being detected. If the user selects "yes," or otherwise advances the process of provisioning the smart power testing device 508, then in interface state 504 some information about the detected device can be entered, such as a room name or other location name, and a more detailed location such as a wall name. This information can be entered manually, or selected from drop down menus, or other interface elements, as is known. This allows a person to identify the specific location of the device 508 in the structure. Once the user saves the information, then in interface state 506 the entered information and status of the device 508 can be displayed. The application program can allow the user to look at the status of any deployed device by selecting appropriate menu headings or on a summary status screen. The process of connecting a smart power testing device to an outlet, turning the smart power testing device on, detecting the active smart power testing device, and entering location information for the smart power testing device is repeated for each smart power testing device being deployed in the structure. As will be appreciated, this process can be tedious, so it is preferable that the application program be designed to make entering such information as easy as possible. Once all of the smart power testing devices are deployed, then testing can begin.

Figure 6:
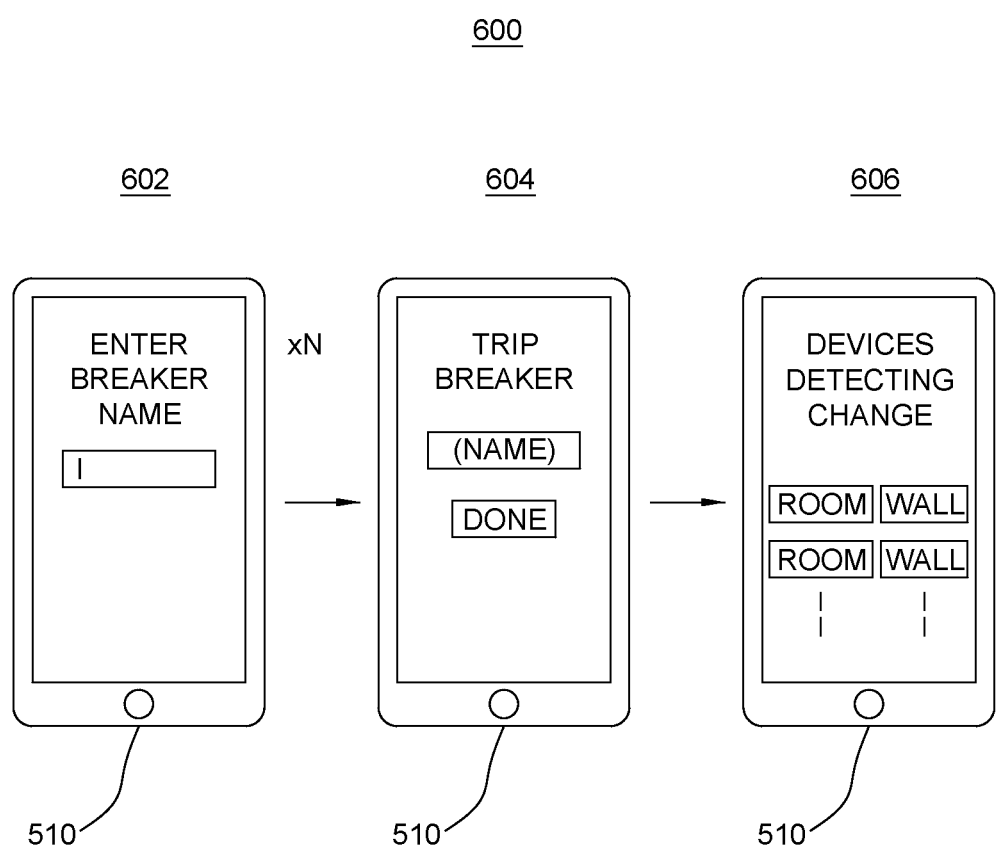
FIG. 6 shows an interface sequence of a mobile device running an application for operating smart power testing devices for a process of testing breakers and identifying the smart power testing devices operating on the circuit controlled by each breaker, in accordance with some embodiments.

FIG. 6 shows an interface sequence 600 of a mobile device running an application for operating smart power testing devices for a process of testing breakers and identifying the smart power testing devices operating on the circuit controlled by each breaker, in accordance with some embodiments. In this sequence 600, the same mobile device is shown in each of three interface states 602, 604, 606. The sequence shows the process of entering breaker information, selecting a breaking for testing, and then showing the results (change of status of deployed smart power testing devices). In interface state 602, the mobile device can prompt the user to enter a breaker name. This can be a name such as "LEFT 1" indicating the breaker at the top of the left column of breakers; "LEFT 2" would be the breaker directly below that one, and so on. This process can be repeated to enter in the names of several or all of the breakers on a breaker panel, or each breaker can be processes serially through the sequence 600. In interface state 604, the user has entered a name for a breaker is ready to test the breaker circuit by turning the breaker off. The name of the breaker being tested can be shown on the mobile device in interface state 604. A graphical user interface button can be provided that a user can press or click on to advance to interface state 606. Alternatively, the mobile device can automatically advance to interface state 606 upon receiving a message from one or more of the deployed smart power testing devices. In interface state 606 the mobile device displays information describing the deployed smart power testing devices that indicate they have detected a change in the AC voltage at their respective outlets. When a deployed smart power testing device detects a substantial change in AC voltage, it can automatically report detection of the change by transmitting a message indicating such to the mobile device using conventional wireless networking communication. Alternatively, after turning off the breaker, the user can have the mobile device poll the deployed smart power testing devices to determine their status, where, in response to being polled, each smart power testing device will report the status of the AC voltage at its respective outlet. Accordingly, upon reaching interface state 606, the deployed smart power testing devices on the circuit connected to the respective breaker being tested are then known. This information can be recorded in a data structure that cross references breaker names with outlet locations, and this information can be saved, printed, and used for a variety of purposes. States 602, 604, 606 can be repeated for each breaker until each breaker is tested, at which point every outlet being tested will then be mapped to a breaker. In some embodiments it is contemplated that the mobile device can indicate which breakers have been tested, and which still need to be tested. Further, it is contemplated that the mobile device can indicate which, if any, of the deployed smart power testing devices never changed state, indicating there may be another breaker panel for the structure, or an additional breaker needs to be tested.

Figure 7:
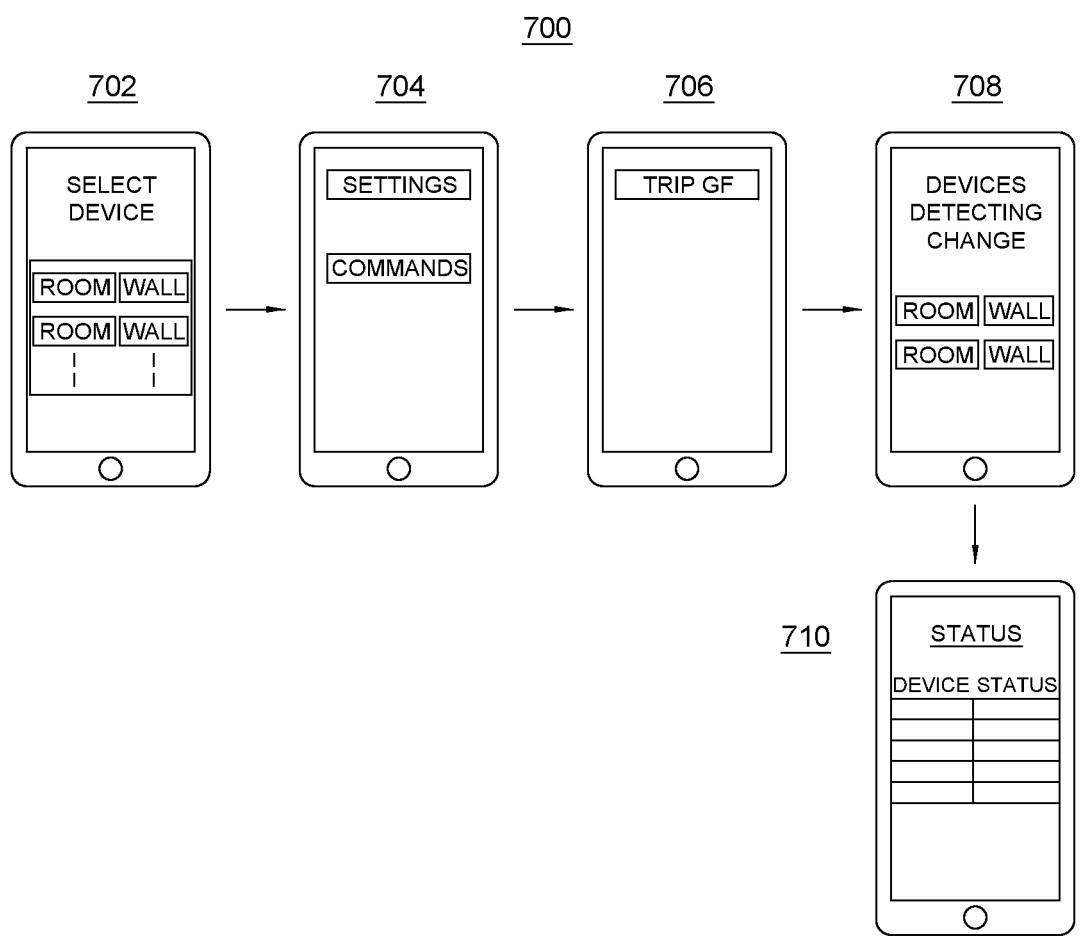
FIG. 7 shows an interface sequence of a mobile device running an application for operating smart power testing devices for a process of testing ground fault interruption, in accordance with some embodiments.

FIG. 7 shows an interface sequence 700 of a mobile device running an application for operating smart power testing devices for a process of testing ground fault interruption, in accordance with some embodiments. In this sequence it is assumed that all of the smart power testing device have been deployed, and their information entered for recordation into the mobile device via the application program (e.g. as in FIG. 5). In interface state 702 the mobile device can display a list of deployed smart power testing devices by their location. Any of these can be selected to advance to interface state 704 in which the user is offered the option to interface with the settings for the selected smart power testing device, or to command the selected smart power testing device to undertake an operation. The user can select an appropriate interface element to advance to interface state 706 in which the user can selection an option to cause the selected smart power testing device to create a ground fault condition (e.g. via switch 112). In interface state 706 the user is presented with an interface object that can be selected to cause the selected smart power testing device to activate its ground fault circuit. Upon doing so, the mobile device can transmit a message to the selected smart power testing device indicting that it is to activate its ground fault circuit. Upon activating its ground fault circuit, the GFCI on the breaker circuit should be activated, removing power from the circuit. As a result, in interface state 708, the mobile device can list the outlet locations that lost AC voltage, indicating which outlets are on the same GFCI circuit. That is, in interface state 708, any deployed smart power testing devices that lost AC voltage as a result of initiating a ground fault in interface state 706 will indicate, through a message or upon being polled, that they lost AC voltage. This process commences by cross referencing the identifier of each such deployed smart power testing device and the information entered for it in interface state 504, and then displaying that information for each deployed smart power testing device that detected a change in AC voltage. In interface state 710 a status summary screen can be presented to show the status of each smart power testing device that has been detected/deployed.

Figure 8:
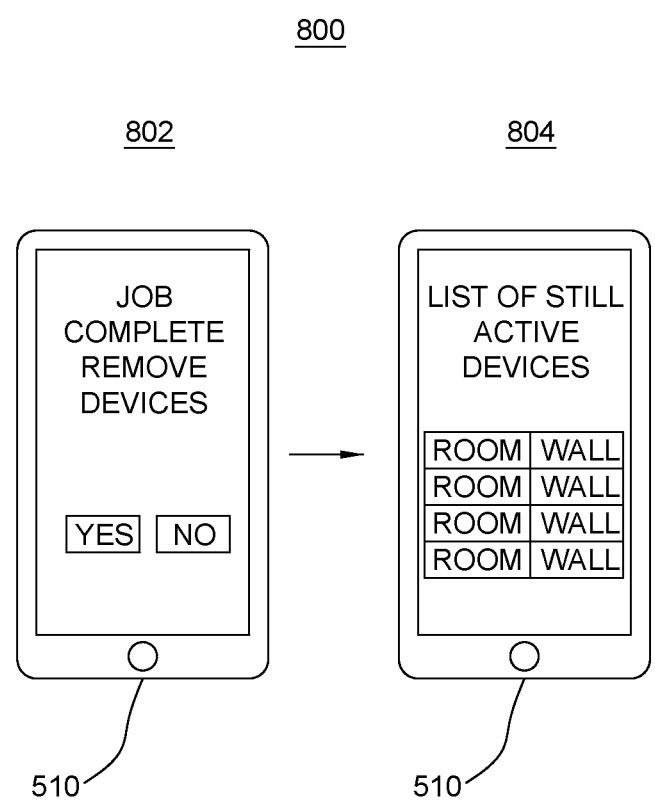
FIG. 8 shows an interface sequence of a mobile device running an application for operating smart power testing devices for a process of removing smart power testing devices from a structure after completion of breaker testing and mapping, in accordance with some embodiments.

FIG. 8 shows an interface sequence 800 of a mobile device running an application for operating smart power testing devices for a process of removing smart power testing devices from a structure after completion of breaker testing and mapping, in accordance with some embodiments. Thus, in interface state 802, the mobile device displays an interface in which the user indicates that the testing is complete. Upon affirming that the testing is complete, the mobile device transitions to interface state 804 in which a list of active and still deployed smart power testing devices is shown by location. This allows a user to collect and deactivate all of the deployed smart power testing devices, removing them from the list in interface state 804 as they are deactivated, to ensure that the user does not leave any of the deployed smart power testing devices behind upon leaving the site of the structure. Deactivation can be a manual process where a power button is actuated at the smart power testing device, and in response the smart power testing device can communicate to the mobile device that it is being turned off. In response, the application program can prompt a user to confirm that the particular smart power testing device is being turned off intentionally. Any smart power device not deactivated will remain categorized as active by the application program. If the user leaves the site, forgetting about one of the smart power testing devices, the mobile device can provide an audible or tactile alert when communications with any smart power testing devices listed as still active is lost.

FIG. 9 shows a flow chart diagram of a method 900 for initializing a plurality of smart power testing devices, in accordance with some embodiments. The method 900 follows the sequence 500. Thus, at the start 902 a control device, such as a mobile device, is powered on and running the application program. The control device has wireless communication capability for wireless networking communication. In step 904 the user activates a smart power testing device and connects it to an outlet in a structure. Activating the smart power testing device can simply involve pressing a power button on the smart power testing device to cause it to turn on, at which point it will automatically go into an initial deployment mode where it begins broadcasting its identifier. In step 906 the control device can receive the transmitted identifier to sense or detect the activated smart power testing device. Upon receiving the transmitted identifier, the control device can respond to the activated smart power testing device to indicate that it has received the identifier, at which point the activated smart power testing device can stop broadcasting its identifier. The control device can display the received identifier and display an interface to the user such as shown in interface state 502, allowing the user to visually verify that the detected smart power testing device is the one that the user just activated, such as by comparing the displayed identifier with a label or other writing on the activated smart power testing device. In step 908 the user can enter location information for the detected smart power testing device, as indicated in interface state 504. The information can be, for example, "BEDROOM 1" and "EAST WALL," or any other such descriptive information as desired by the user. In step 910 the method 900 determines if more smart power testing devices are to be activated. If so, then the method returns to step 904, or if multiple smart power testing devices are activated at the same time, the method 900 can cycle through steps 908, 910 for each activated smart power testing device. When all of the smart power testing devices are provisioned, then the method 900 ends in step 912 and breaker testing can then commence.

FIG. 10 shows a flow chart diagram of a method 1000 for mapping electric power distribution circuits by serially tripping and resetting breakers and determining which smart power testing devices indicate detection of a change in electric voltage, and mapping the locations of the smart power testing devices to the respective breaker, in accordance with some embodiments. Thus, at the start 1002, a plurality smart power testing devices have been deployed in a structure, and provisioned in the control device so that their location is associated with their identifier. In step 1004 the control device can enter a test mode in which a breaker is identified, and then toggled in step 1006. As a result of toggling the selected breaker in step 1006, in step 1008 one or more of the deployed smart power testing devices will communicate with the control device, indicating a detection of a change in AC voltage. Since the smart power testing devices are battery powered, the fact that the AC voltage has been removed from the outlet does not prevent them from operating or communicating. All of the deployed smart power testing devices indicating detection of change in AC voltage are then associated with the selected breaker being tested. In step 1010 the breaker can be reset, restoring power to the circuit. In step 1012, optionally, the deployed smart power testing devices detecting a change in AC voltage (i.e. from zero to 120 VAC) can again indicate detection of the change. This step can be used as a confirmation step to ensure that there isn't some other reason a given deployed smart power testing device lost AC voltage. In step 1014 the control device can finalize the association of the deployed smart power testing devices that detected AC voltage changes with the breaker being tested. The record can be stored in the control device so that it can be accessed, transmitted, and/or printed later. In step 1016 the method 1000 determines if there are more breakers to test, and if so, the method returns to step 1006 in which the user operates the control device to select a new breaker, entering a name and description, and the commencing to toggle the breaker and re-iterate the method 1000.

Once all of the breakers have been tested, the method can end in step 1018. At which point the control device will have, for each breaker tested, a list of outlet locations on that breaker's circuit. This information can be used subsequently for a variety of purposes. For example, various reports can be generated to show any issues found, to show which outlets are connected to each of the various breakers, and so on. The locations of outlets relative to breakers can be indicated in a report. The system can generate a final inspection report for a tested house/business indicating whether the power distribution wiring passes or fails. Reports can be formatted into electronic documents and sent by email, for example.

A system has been disclosed that allows a person to map the various electric power circuits controller by and connected to each of a plurality of breakers in a structure. The system uses smart power testing devices where each smart power testing device is connected to one electrical outlet in the structure. Each smart power testing device can communicate with a control device, such as a cellular telephone or smartphone device. When a breaker is turned off, each smart power device that senses a loss of voltage at its respective electrical outlet will indicate such to the control device. This automatically creates a mapping of which electric outlets are connected to each breaker circuit at the control device, which can be transferred as a report to another computing device if desired. This process eliminates the manual operations of turning off a breaker, and then manually testing numerous outlets to see whether voltage is still present, which is often performed redundantly because the user does not know which outlets are connected to which breakers, and as a result, until a given outlet has been found to be connected to a given break, it must be retested every time a new breaker is opened. Thus, substantial time is saved in mapping out circuits. Furthermore, outlets are not overlooked, or forgotten about as long as a smart power testing device is connected to an outlet. The system also provides the benefit of remotely triggering ground faults to test the ground fault interruption, as well as to identify which outlets with interrupters are connected to a given breaker circuit. Additionally, the system ensures that no smart power device is left behind as the control device can detect loss of signal for a smart power device that has not deactivated to alert the user that they may have inadvertently left a smart power testing device behind. These benefits are a substantial improvement in efficiency and time over the manual process of testing outlets.

The claims appended hereto are meant to cover all modifications and changes within the scope and spirit of the present invention.

What is claimed is:

1. A system for identifying and testing electric power distribution circuits in a structure, the structure including a breaker box having a plurality of breakers, each one of the breakers connected to a respective one of a plurality of electric power circuits in the structure, each one of the plurality of electric power circuits having at least one outlet in the structure, the system comprising:
   a plurality of smart power testing devices, each one of the plurality of smart power testing device configured to be connected to a respective one of a plurality of electrical outlets in the structure;
   each one of the plurality of smart power testing devices having:
      a processor;
      an AC connector configured to connect to an outlet at the outlet;
      an AC voltage detector configured to provide an output to the processor indicating the presence of an AC voltage at the AC connector;
      a battery coupled to the processor and operable to provide power to the processor when an AC voltage is not present at the AC connector;
      a wireless transceiver coupled to the processor;
   a control device having a wireless transceiver configured to communicate with each of the plurality of smart power testing devices; and
   wherein each one of the plurality of smart power testing devices is configured to detect a change in AC voltage at its respective AC connector, and upon detecting the change in AC voltage, transmit a message to the control device via its respective wireless transceiver indicating detection of the change in AC voltage.

2. The system of claim 1, wherein the control device creates a record of the plurality of electric power outlets, and which of the plurality of smart power testing devices indicate detection of change in AC voltage contemporaneously.

3. The system of claim 1, wherein each one of the plurality of smart power testing devices are configured to transmit a deactivation message to the control device upon being deactivated.

4. The system of claim 3, wherein the control device is configured to detect a loss of connection with any of the plurality of smart power testing devices that have not been deactivated and provide an alert in response.

\* \* \* \* \*